US008969753B2

(12) United States Patent
Straemke

(10) Patent No.: US 8,969,753 B2
(45) Date of Patent: Mar. 3, 2015

(54) PLASMA TREATMENT INSTALLATION

(76) Inventor: Siegfried Straemke, Baesweiler (DE)

( * ) Notice: Subject to any disclaimer, the term of this patent is extended or adjusted under 35 U.S.C. 154(b) by 1481 days.

(21) Appl. No.: 11/798,795

(22) Filed: May 17, 2007

(65) Prior Publication Data

US 2007/0267389 A1 Nov. 22, 2007

(30) Foreign Application Priority Data

May 18, 2006 (DE) .................... 20 2006 007 937 U

(51) Int. Cl.
| | | |
|---|---|---|
| *B23K 9/00* | (2006.01) | |
| *C23F 1/00* | (2006.01) | |
| *C23C 14/00* | (2006.01) | |
| *C23C 16/458* | (2006.01) | |
| *C23C 14/50* | (2006.01) | |
| *H01L 21/677* | (2006.01) | |
| *H01L 21/687* | (2006.01) | |

(52) U.S. Cl.
CPC ........... *C23C 16/4584* (2013.01); *C23C 14/505* (2013.01); *H01L 21/67742* (2013.01); *H01L 21/68771* (2013.01); *H01L 21/68785* (2013.01)
USPC ............ 219/121.43; 219/121.57; 219/121.34; 219/121.19; 156/345.43; 156/345.28; 156/345.41; 156/345.47; 204/192.32; 204/298.33; 204/298.34

(58) Field of Classification Search
CPC ................................................ H01J 37/32082
USPC ............. 219/121.43, 121.57, 121.34, 121.19; 156/345.43, 345.28, 345.41, 345.47; 204/192.32, 298.33, 298.34; 118/723; 250/492.2; 432/205, 206, 241; 148/239, 566
See application file for complete search history.

(56) References Cited

U.S. PATENT DOCUMENTS

| | | | |
|---|---|---|---|
| 4,226,208 A | | 10/1980 | Nishida et al. |
| 4,501,428 A | * | 2/1985 | Ueno et al. .................... 277/345 |
| 5,044,871 A | * | 9/1991 | Davis et al. ................... 414/805 |
| 5,217,501 A | | 6/1993 | Fuse et al. |
| 5,221,201 A | * | 6/1993 | Yamaga et al. ............... 432/241 |
| 5,370,737 A | * | 12/1994 | Mathis ...................... 118/723 E |
| 5,388,944 A | | 2/1995 | Takanabe et al. |
| 5,586,585 A | * | 12/1996 | Bonora et al. ................... 141/93 |
| 5,618,388 A | * | 4/1997 | Seeser et al. ............. 204/192.12 |
| 5,717,186 A | * | 2/1998 | Drissen et al. ........... 219/121.54 |

(Continued)

FOREIGN PATENT DOCUMENTS

| | | |
|---|---|---|
| DE | 290 224 A5 | 5/1991 |
| DE | 44 12 902 A1 | 11/1994 |

(Continued)

OTHER PUBLICATIONS

JP05-271931A-1993 machine translation.*

*Primary Examiner* — Dana Ross
*Assistant Examiner* — Ket D Dang
(74) *Attorney, Agent, or Firm* — Miles & Stockbridge P.C.; David R. Schaffer

(57) ABSTRACT

A plasma treatment installation including at least two stationary workpiece holders adapted for controlled rotation about their respective axis and having supporting plates for supporting workpieces for the treatment thereof, at least one hood to be set on a workpiece holder that is adapted to enclose each of a plurality of workpiece holders to form a sealed treatment space, and a manipulator for automatically equipping the supporting plates of a workpiece holder with workpieces, while the other workpiece holder is covered by the hood to perform the plasma treatment of the workpieces.

10 Claims, 3 Drawing Sheets

(56) References Cited

U.S. PATENT DOCUMENTS

| | | | |
|---|---|---|---|
| 5,752,796 A * | 5/1998 | Muka | 414/217.1 |
| 5,829,969 A * | 11/1998 | Miyashita et al. | 432/253 |
| 6,063,248 A | 5/2000 | Bourez et al. | |
| 6,296,735 B1 * | 10/2001 | Marxer et al. | 156/345.32 |
| 6,390,753 B1 * | 5/2002 | De Ridder | 414/160 |
| 6,607,602 B1 * | 8/2003 | Granneman et al. | 118/719 |
| 6,609,877 B1 | 8/2003 | Ramsay | |
| 6,911,112 B2 * | 6/2005 | An | 156/345.31 |
| 2001/0048867 A1 * | 12/2001 | Lebar et al. | 414/217 |
| 2003/0035705 A1 | 2/2003 | Johnson | |
| 2005/0005860 A1 | 1/2005 | Shimojima et al. | |
| 2005/0211264 A1 * | 9/2005 | Kostenko et al. | 134/1.1 |
| 2006/0045664 A1 * | 3/2006 | Niewmierzycki et al. | 414/217 |

FOREIGN PATENT DOCUMENTS

| | | | |
|---|---|---|---|
| DE | 102 21 461 A1 | 12/2003 | |
| GB | 1 321 640 | 6/1973 | |
| JP | 05271931 A * | 10/1993 | C23C 14/56 |
| JP | 05271931 A1 | 10/1993 | |
| WO | WO 94/18354 | 8/1994 | |
| WO | WO 01/72618 A1 | 10/2001 | |

* cited by examiner

PLASMA TREATMENT INSTALLATION

TECHNICAL FIELD

The invention is directed to a plasma treatment installation with workpiece holders for receiving workpieces to be subjected to a plasma treatment, such as a plasma nitration, or to be provided with a coating in a plasma reactor.

BACKGROUND ART

The workpieces to be treated in a plasma installation, which are subjected to a heat treatment or a coating, must be charged with a defined distance of 1 cm, for example. This is normally done manually and takes a long time, causing a low utilization level of the installation. In practice, charging, i.e. inserting the workpieces into the workpiece carrier, has been performed outside the plasma reactor and the charged workpiece carrier has then been moved into the plasma reactor by means of a crane, either manually or automatically. This also requires a complex system technology and does not contribute to a substantial reduction of the time effort.

SUMMARY OF THE INVENTION

It is an object of the invention to develop a plasma treatment installation such that a higher utilization level is achieved with relatively little technical effort.

The plasma treatment installation of the present invention comprises at least two workpiece holders, each of which can be covered with a hood to close a sealed treatment space in which the plasma treatment takes place. While one of the workpiece holders is equipped with workpieces by a manipulator, the plasma treatment is carried out on the other workpiece holder. The workpiece holder forms a plasma reactor together with the hood.

Advantageous embodiments of the invention are defined in the dependent claims.

Preferably, the workpiece holder is provided with a base or a bottom adapted to be sealingly connected with the hood. Thus, the workpiece holder forms a part of the plasma reactor's shell which is completed by fitting the hood.

According to a preferred embodiment of the invention, a manipulator handles at least four workpiece holders such that, alternately, two of the workpiece holders are open and two others are covered with a respective hood. Such a system offers the advantage of a better utilization of the manipulator which generally is a complex robot. Here, it can handle four (or more) plasma cells formed by a workpiece holder and a hood. Generally, each workpiece holder may be provided with a hood of its own that is either lifted or lowered. The effort is reduced if two respective workpiece holders alternately use the same hood.

The plasma cell may be equipped with additional aggregates which are advantageously also handled or assisted by the manipulator. For example, a threading station may be integrated that screws suspension screws, which circulate in the system, into and out from the workpieces so that the workpieces can be suspended in the workpiece holder. Further, the manipulator can perform palletizing and depalletizing tasks.

The following is a detailed description of embodiments of the invention with respect to the drawings.

DETAILED DESCRIPTION OF PREFERRED EMBODIMENTS OF THE INVENTION

Figure 1:
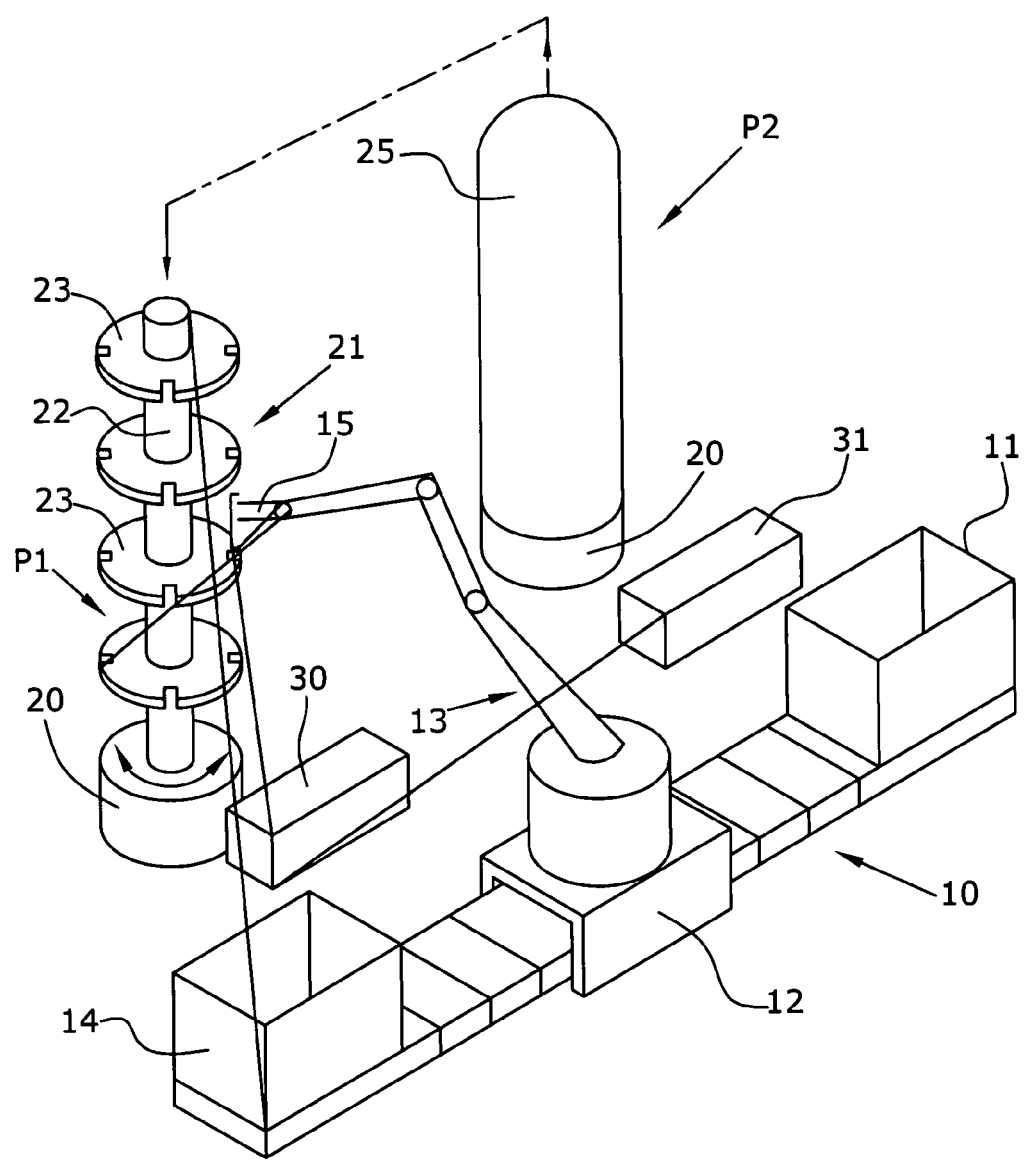
FIG. 1 schematically illustrates a first embodiment of the plasma treatment installation.

The plasma treatment installation illustrated in FIG. 1 comprises a conveyor 10 on which receptacles 11 containing the workpieces are transported. In the present case, the conveyor 10 passes beneath a bridge 12 carrying a manipulator 13. The manipulator takes the workpieces from a receptacle 11 to feed it to one of the two plasma cells. After the treatment, the manipulator removes the workpieces from the plasma cell and inserts them into the issuing container 14. The manipulator is a controlled robot with at least three axes of movement, whose the robot hand 15 is adapted to reach all target positions mentioned.

In the present instance, two plasma cells P1 and P2 are provided that are stationary. Each of the plasma cells includes a stationary base 20 or bottom carrying an upright workpiece holder 21. The workpiece holder 21 comprises a vertical axis 22 that is rotatable under control and to which supporting plates 23 are attached at different heights so that the individual workpieces can be suspended therefrom. A potential terminal (not illustrated) couples the workpiece holder with an electric potential transferred to the individual workpieces. A counter electrode is included in the treatment space.

The treatment space is closed by means of a hood 25. This hood connects to the base 20 in a pressure-tight manner. A controlled transfer device may automatically lift the hood and relocate it from one base 20 to another, so that one hood 25 is provided for two plasma cells P1, P2.

The workpieces individually removed by the manipulator 13 may be equipped with auxiliary means. For example, an auxiliary device 30 is provided that forms a threading station where a screw is threaded into the workpiece to allow the workpiece to be suspended from the workpiece holder 21. After the treatment, the auxiliary device 30 also unscrews the screw from the workpiece.

Another auxiliary device 31 performs a laser labeling of the workpieces fed thereto by the manipulator 13.

Figure 2:
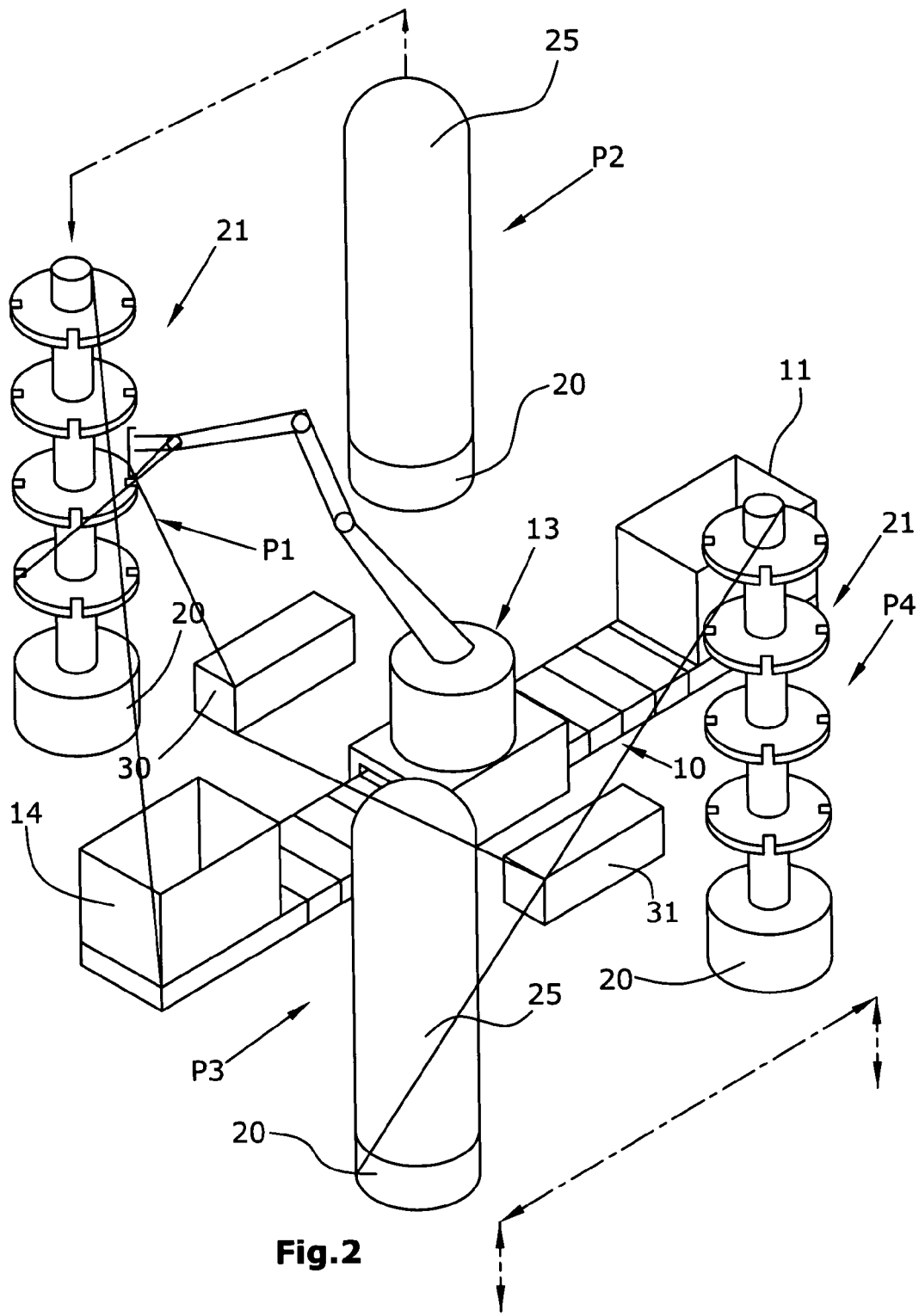
FIG. 2 shows a second embodiment of the plasma treatment installation with a total of four plasma cells.

In the embodiment of FIG. 2, the manipulator 13 serves a total of four plasma cells P1, P2, P3, P4. As in the first embodiment, the plasma cells P1 and P2 are arranged on one side of the conveyor 10, whereas the other two plasma cells are located on the opposite side thereof. The manipulator 13 is situated at the geometrical center of the four plasma cells, so that it can reach each plasma cell.

The plasma cells are formed similar to the first embodiment, i.e. each plasma cell has a workpiece holder 21 and two plasma cells P1 and P2 share a hood 25 that may be relocated. The other two plasma cells P3 and P4 also share a hood 25 that is relocatable. Each of the plasma cells is connected to a suction source via its base, so that it can be evacuated. Moreover, gases may be fed into the respective treatment spaces through lines (not illustrated).

Figure 3:
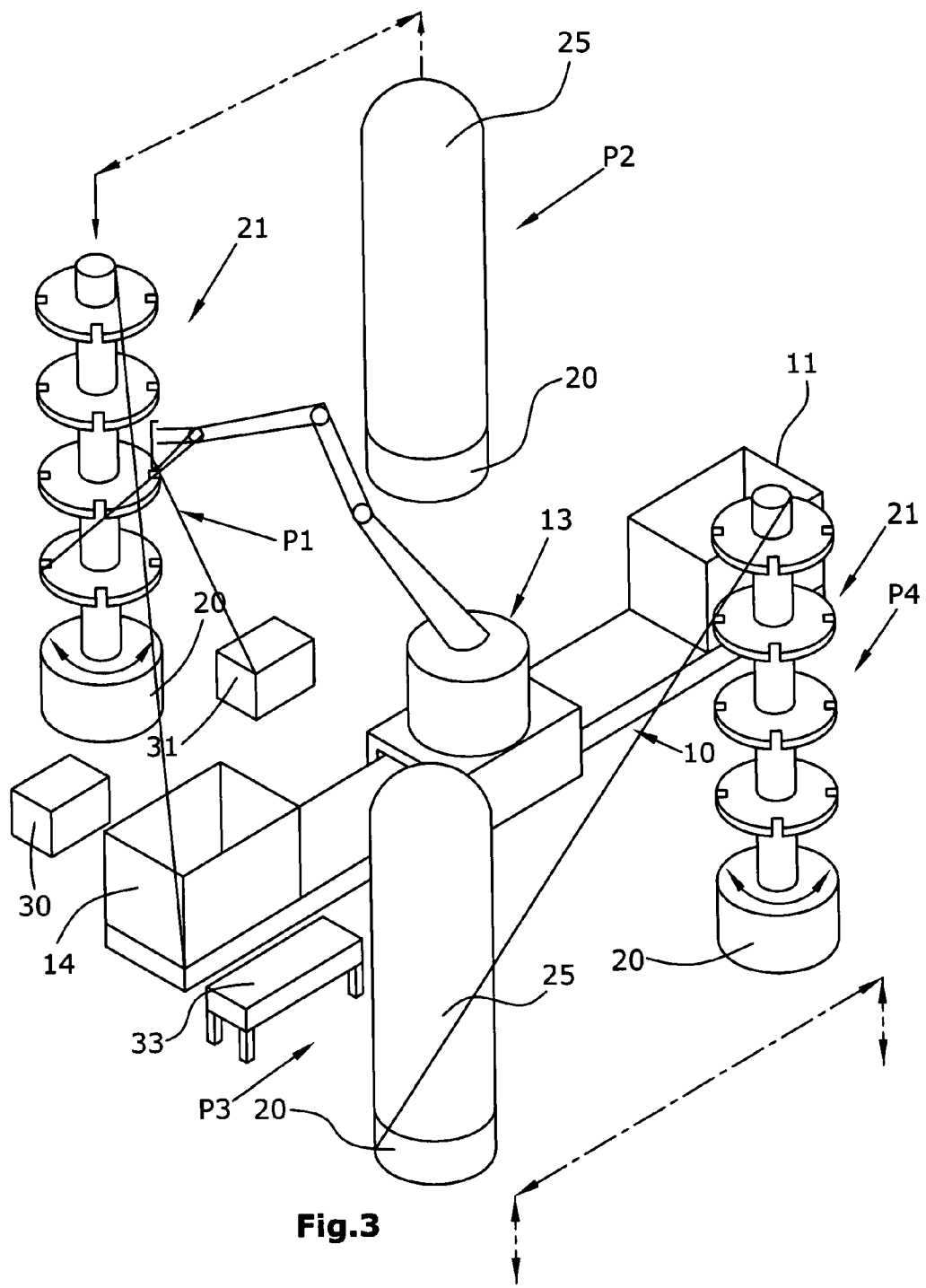
FIG. 3 shows the plasma treatment installation of FIG. 2 with additional auxiliary aggregates.

The embodiment of FIG. 3 corresponds to that of FIG. 2, with the auxiliary devices 30 and 31 discussed with respect to FIG. 1 being provided in addition. Another auxiliary device 33 is a discharge conveyor with which the treated objects can be transported away.

Although the invention has been described and illustrated with reference to specific illustrative embodiments thereof, it is not intended that the invention be limited to those illustrative embodiments. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

What is claimed is:

1. A plasma treatment installation comprising at least two stationary workpiece holders, each adapted for controlled rotation about its respective vertical axis and having supporting plates for supporting workpieces for the treatment thereof, at different rotational positions about said vertical axis, at least one hood with only one hood to be set on one of a pair of the at least two stationary workpiece holders at a time, said hood being adapted to enclose said one stationary workpiece holder within said hood to form a sealed treatment space within which said plasma treatment is performed, and a manipulator for automatically equipping the supporting plates of a second one of the pair of the at least two stationary workpiece holders at said different rotational positions with workpieces, while said one of the pair of the at least two stationary workpiece holders is covered by the hood to perform the plasma treatment of the workpieces within said hood.

2. The plasma treatment installation of claim 1, wherein each one of the stationary workpiece holders is fastened to a stationary base and said hood being adapted to form a sealing connection against said base.

3. The plasma treatment installation of claim 1, wherein said manipulator serves at least four stationary workpiece holders such that, alternately, two of the stationary workpiece holders being open and two others being covered by a respective hood.

4. The plasma treatment installation of claim 1, wherein the manipulator provides the workpieces with auxiliary means before connecting them with the stationary workpiece holder.

5. The plasma treatment installation of claim 4, wherein the auxiliary means are suspension devices.

6. The plasma treatment installation of claim 4, wherein the auxiliary means are covering means for partially covering the workpiece surfaces.

7. The plasma treatment installation of claim 1, wherein the manipulator processes the workpieces.

8. The plasma treatment installation of claim 1, wherein the manipulator is controlled such that it supplies the workpieces to a processing station in the form of an auxiliary device prior to or after loading the stationary workpiece holder.

9. The plasma treatment installation of claim 1, wherein the manipulator transfers the treated workpieces onto pallets.

10. The plasma treatment installation of claim 1, wherein said hood is movable by an automatic transfer device to automatically lift the hood and relocate it from one stationary workpiece holder to another.

* * * * *